United States Patent [19]

Hu

[11] Patent Number: 5,124,546
[45] Date of Patent: Jun. 23, 1992

[54] METHOD AND APPARATUS FOR REFRACTING LIGHT TO AN OPTICAL DETECTOR

[75] Inventor: Charles C. Hu, Saratoga, Calif.

[73] Assignee: The Watt Stopper, Santa Clara, Calif.

[21] Appl. No.: 700,337

[22] Filed: May 6, 1991

Related U.S. Application Data

[63] Continuation of Ser. No. 513,257, Apr. 24, 1990, abandoned.

[51] Int. Cl.$^5$ .................................................. H01J 3/14
[52] U.S. Cl. ........................................ 250/216; 359/725
[58] Field of Search ................ 250/216; 350/441, 447, 350/452, 286; 359/725, 831, 837

[56] References Cited

U.S. PATENT DOCUMENTS

| | | | |
|---|---|---|---|
| 3,170,025 | 2/1965 | Ino | 350/441 |
| 4,187,001 | 2/1980 | Redwitz et al. | 350/445 |
| 4,322,124 | 3/1982 | Padgitt et al. | 350/441 |
| 4,711,972 | 12/1987 | O'Neill | 350/286 |
| 4,849,622 | 7/1989 | Beggs | 250/216 |
| 4,900,914 | 2/1990 | Raff et al. | 250/216 |

FOREIGN PATENT DOCUMENTS 3338825  10/1985  Fed. Rep. of Germany ...... 350/452

*Primary Examiner*—David C. Nelms
*Assistant Examiner*—K. Shami
*Attorney, Agent, or Firm*—Townsend and Townsend

[57] ABSTRACT

A method and apparatus for refracting light into the field of view of an optical detector without the use of mirrors. The invention avoids an out-of-focus problem caused by the increase in the focal length with the use of mirrors which require the light to travel a greater distance than light directly impinging on the optical detector. The preferred embodiment of the present invention provides a pair of prisms which refract infrared light into the field of view of the optical detector. The prisms are mounted immediately adjacent and on either side of the optical detector so that they can refract light from outside the field of view of the optical detector and direct the light directly to the optical detector without increasing the distance traveled by the light. Each prism is preferably a thin array of prisms formed from angled grooves on a planr, transparent material.

7 Claims, 3 Drawing Sheets

METHOD AND APPARATUS FOR REFRACTING LIGHT TO AN OPTICAL DETECTOR

This is a continuation of application Ser. No. 07/513,257, filed Apr. 24, 1990, now abandoned.

BACKGROUND

The present invention relates to optical detectors, and, in particular, to an optical detector for use in activating lights upon detection of infrared radiation from a person entering a room.

Many types of devices have been designed to detect the presence of a person in a room in order to automatically light the room when the person is in the room, and turn off the lights when the person leaves. One type of device detects the motion of a person by sending out and receiving back radar-type signals. Another type of device detects the infrared radiation emitted from a person's body. There are commercially available optical detectors for detecting infrared radiation. One type is a passive infrared (PIR) cell.

Such detectors have a relatively narrow angle of receiver sensitivity, or field of view. There is a maximum sensitivity when the infrared radiation is received straight-on, with the sensitivity decreasing as the angle from which the radiation is received increases. This has the effect of limiting the amount of a room which can be covered by such a device, requiring that it be strategically placed or that multiple detectors be used.

One solution to this problem is disclosed in U.S. Pat. No. 4,644,147. A pair of curved mirrors is arranged on either side of the PIR cell to intercept infrared light which has gone past the detector and redirect it back to the detector at an angle which is within the field of view of the detector.

SUMMARY OF THE INVENTION

The present invention provides a method and apparatus for refracting radiation into the field of view of an optical detector without the use of mirrors. The invention thus avoids an out-of-focus problem caused by the increase in the focal length with the use of mirrors which require the radiation to travel a greater distance than radiation directly impinging on the optical detector.

The preferred embodiment of the present invention provides a pair of prisms which refract infrared radiation into the field of view of the optical detector. The prisms are mounted immediately adjacent and on either side of the optical detector so that they can refract radiation from outside the field of view of the optical detector and direct the radiation directly to the optical detector without increasing the distance traveled by the radiation.

In one embodiment, a special prism is used which is much narrower than a standard prism. The special prism acts like a Fresnel lens in that it contains a large number of small prisms. This allows the device to be compactly built. The present invention provides a total coverage of greater than 180 degrees for the optical detector.

The present invention is preferably used with a commercially available Fresnel lens to focus the radiation presented to the detector. Because the focal length is not changed by the prism, as it would be with mirrors, the Fresnel lens does not have to be modified to adjust for the varying focal lengths. The focusing of the radiation makes a significant difference in the area covered by the detector. For example, an unfocused detector may have a range of less than 10 feet, while a focused detector may have a range of 30 feet.

DETAILED DESCRIPTION OF THE PREFERRED EMBODIMENTS

Figure 1:
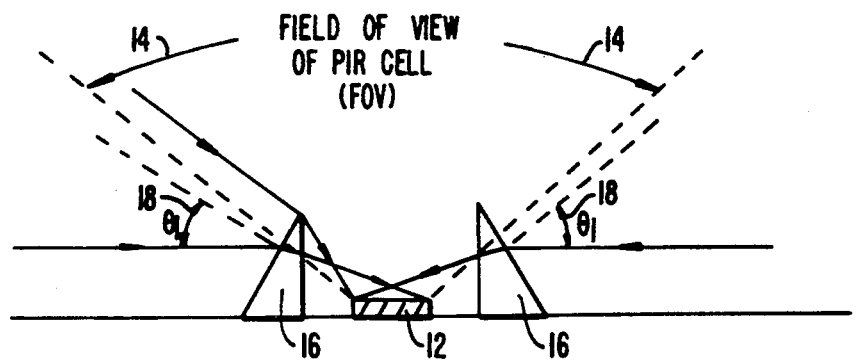
FIG. 1 is a diagram illustrating a side view of the refraction of radiation to an optical detector according to the present invention.
Figure 2:
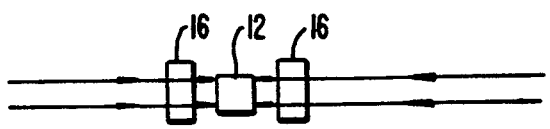
FIG. 2 is a top view of the diagram of FIG. 1.

FIG. 1 illustrates an optical detector using a passive infrared (PIR) cell 12 according to one embodiment of the present invention. PIR cell 12 has a limited field of view as indicated by arrows 14. This field of view can be increased by the use of two prisms 16. Each prism refracts light within an angle indicated by arrows 18 to within the field of view 14 of PIR cell 12. The use of the two prisms thus increases the effective field of view of the PIR cell 12 to 180 degrees. This arrangement is shown from the top in FIG. 2.

The proper position and shape of the prism is calculated so that the dead angle 18 of the PIR cell will be intercepted, with the incident rays being guided to the surface of the PIR cell 12. The total coverage of the PIR cell then becomes angle 18 plus field of view 14 plus angle 18. By adjusting the shape of the prism and the location of the prism, the total angle of view could be adjusted to greater than 180 degrees.

Figure 3:
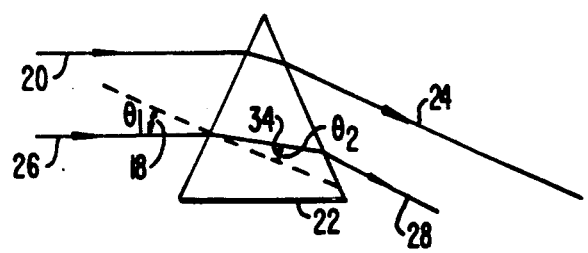
FIG. 3 is a diagram illustrating the refraction of radiation with a single prism according to the present invention.

FIG. 3 illustrates the refraction of an incident ray 20 by prism 22 to give an emerging ray 24. A separate, parallel incident ray 26 will produce an emerging ray 28. As can be seen, the angle between emerging ray 28 and incident ray 26 is indicated by arrows 18.

Figure 4:
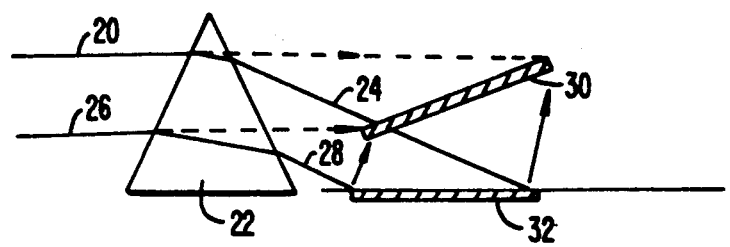
FIG. 4 is a modification of the diagram of FIG. 3 illustrating the position of the image with and without the prism.

FIG. 4 illustrates the same prism 22 as shown in FIG. 3 with the addition of showing an emerging picture 30 which would occur without the prism and a picture 32 that is produced using the prism. As can be seen, if an optical detector is mounted so that its surface is where image 32 is shown, it would receive image 32, but would not receive image 30 without the prism.

Referring back to FIG. 3, the index of refraction needed for the prism is equal to angle 18 divided by angle 34. The angle 34 which is needed can be determined from the positioning of the prism relative to the optical detector, which should be placed so that it will receive image 32 as shown in FIG. 4.

Figure 5:
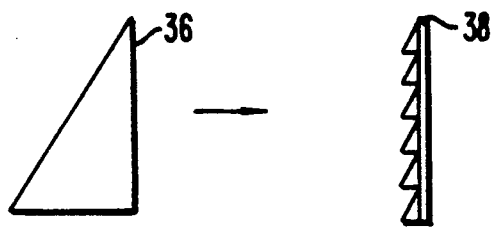
FIG. 5 is a diagram of a Fresnel-type prism.

FIG. 5 shows a prism 36 and its equivalent array of prisms 38. The array of prisms 38 provides the same refraction, but can be built to give a much thinner, more compact lens. This is similar to a Fresnel lens, which is a thin optical lens with rings. Instead, array 38 is a thin optical prism with grooved lines. The slope of each groove is actually the same as a full-size prism slope. It is preferably made of a thin polypropylene or polyethylene material.

Figure 6:
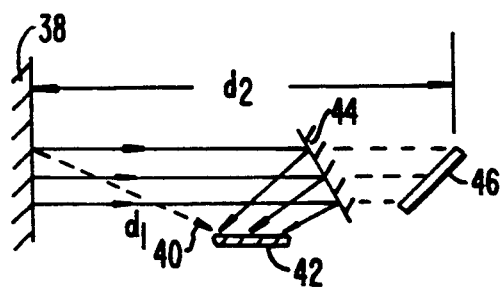
FIG. 6 is a diagram illustrating the difference in focal length for a mirror and a prism.

FIG. 6 illustrates the advantages of the invention. A prism lens 38 is shown directing radiation along a line 40 to an optical detector 42. As can be seen, the distance traveled by the radiation along line 40 is labeled d1. If prism lens 38 was not used, and instead a mirror 44 is used, the radiation would have to travel to the mirror, be reflected off the mirror and onto optical detector 42. This distance can be measured by using the projection of the image 46 on the other side of the mirror. This projection shows the distance from the mirror if the radiation had gone straight instead of being reflected. This total distance, d2, is much greater than d1. Thus, radiation which hits mirror 44 before being directed to detector 42 must travel a longer distance than light which hits detector 42 from within its range of view. Accordingly, the radiation which hits the mirror will be out-of-focus. This out-of-focus condition will reduce the range of the detector significantly. This same problem is not present using the lens 38 of the present invention.

Figure 7:
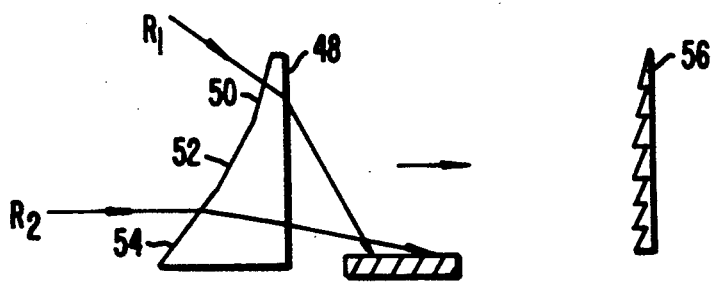
FIG. 7 is a diagram of a prism having multiple angles.

FIG. 7 shows a prism 48 having different slopes 50, 52 and 54, producing different angles of refraction depending upon where the radiation hits the prism. This may be useful depending upon how large the optical detector is and where it is positioned. An equivalent prism array 56 has corresponding variations in its grooves from top to bottom.

Figure 8:
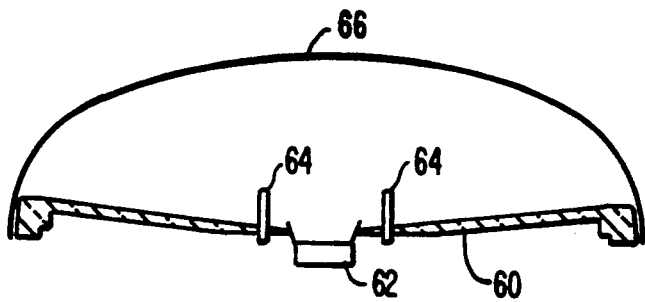
FIG. 8 is a side view of a preferred embodiment of an apparatus incorporating the present invention.

FIG. 8 shows one embodiment of a lens holder 60 which supports a Fresnel lens 66. The two prism arrays, or prism cells 64, are mounted on either side of PIR sensor 62, with the grooved sides pointing outward. The device is covered by curved Fresnel lens 66. Such a Fresnel lens is shown and described in U.S. Pat. No. 4,644,147 and is commercially available. The Fresnel lens is used to focus the radiation onto the sensor to increase the range of the sensor. If the mirrors of the prior art are used, the commercially available Fresnel lens must be modified at the positions corresponding to the angles which will hit the mirror, because of the increased focal length. If this special modification is not done, the range of the sensor will be drastically reduced.

Figure 9:
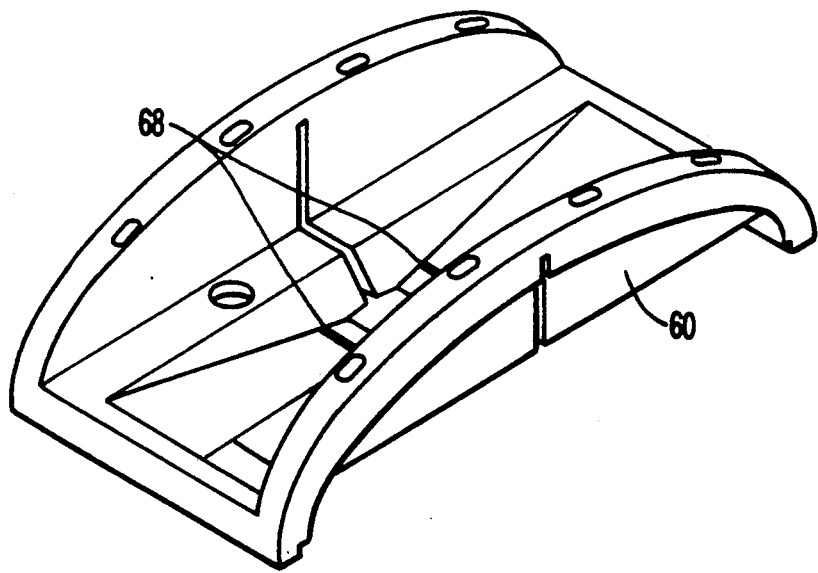
FIG. 9 is a perspective view of the embodiment of FIG. 8.

FIG. 9 shows a perspective view of holder 60 with slots 68 for holding the prism cell arrays.

As will be understood by those skilled in the art, the present invention could be embodied in other specific forms without departing from the spirit or essential characteristics thereof. For example, multiple-prism arrays could be used so that light from a semi-spherical range, rather than the semi-circular range shown in FIGS. 8 and 9, could be monitored. In addition, other structures for the prism or prism array could be used. Accordingly, the disclosure of the preferred embodiment of the invention is intended to be illustrative, but not limiting, of the scope of the invention which is set forth in the following claims.

I claim:

1. A method for increasing the field of view of maximum sensitivity of an infrared detector for detecting infrared radiation, comprising the steps of:
   providing an optical device for refracting infrared radiation;
   forming said optical device with a series of angles and grooves in a planar material to produce an array of miniature prisms; and
   positioning said optical device adjacent said optical detector such that infrared radiation outside said field of view is refracted into said field of view of said optical detector and a substantial portion of infrared radiation within said field of view is not intercepted by said optical device.

2. An apparatus for detecting infrared radiation comprising:
   an infrared detector having a field of view;
   a holder for supporting said infrared detector; and
   first and second prisms mounted on said holder on opposite sides of said detector, leaving an opening above said detector between said prisms, for refracting infrared radiation such that infrared radiation outside said field of view is refracted into said field of view of said optical device.

3. The apparatus of claim 2 wherein said means for refracting radiation comprises a series of grooved lines on a planar substrate forming a series of small prisms.

4. The apparatus of claim 2 further comprising a Fresnel lens mounted above said optical detector and means for refracting radiation.

5. The apparatus of claim 2 wherein said optical detector is an infrared detector.

6. The apparatus of claim 2 further comprising means, responsive to said optical detector, for providing or removing power to a load.

7. An apparatus for detecting infrared radiation comprising:
   an infrared detector having a field of view of maximum sensitivity;
   a pair of prism arrays on opposite sides of said infrared detector, each prism array being a planar substrate with a series of parallel, angled grooves;
   means for supporting each prism array in a position to refract infrared radiation which is outside said field of view into said field of view, and leaving an opening above said detector in said field of view; and
   a Fresnel lens mounted on said means for supporting to direct infrared radiation to said infrared detector and said prism array.

* * * * *